(12) United States Patent
Huang

(10) Patent No.: US 7,323,934 B2
(45) Date of Patent: Jan. 29, 2008

(54) OPERATIONAL TRANSCONDUCTANCE AMPLIFIER

(75) Inventor: Chun-Yi Huang, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 77 days.

(21) Appl. No.: 11/308,776

(22) Filed: May 3, 2006

(65) Prior Publication Data

US 2007/0176680 A1    Aug. 2, 2007

(30) Foreign Application Priority Data

Jan. 27, 2006   (TW) .............................. 95103385 A

(51) Int. Cl.
*H03F 3/45*        (2006.01)
(52) U.S. Cl. ..................... 330/257; 330/253; 330/288
(58) Field of Classification Search ............... 330/257, 330/288, 253
See application file for complete search history.

(56) References Cited

U.S. PATENT DOCUMENTS 5,434,538 A * 7/1995 Lee et al. ..................... 330/84
6,456,142 B1 * 9/2002 Gilbert ......................... 327/356
6,489,849 B1 * 12/2002 Gilbert ......................... 330/284
6,946,828 B1 * 9/2005 Layton .................... 324/117 R

* cited by examiner

*Primary Examiner*—Patricia Nguyen
(74) *Attorney, Agent, or Firm*—Jianq Chyun IP Office

(57) ABSTRACT

An operational transconductance amplifier (OTA) includes a first, a second and a third differential units, a voltage-to-current converting unit and a current subtraction device. The first and the second differential units receive a differential input voltage and the voltage-to-current converting unit converts it into an output current. The OTA adopts a replica scheme, that is, by copying the first differential unit to generate a third differential unit and then performs a subtraction between the first output current from the first differential unit and the second output current from the third differential unit in order to eliminate the static current component in the output current. In addition, since the first and the third differential units have the same layout, the output current will not vary with the channel length modulation of transistors, and the static current component in the output current can be eliminated completely.

20 Claims, 2 Drawing Sheets

US 7,323,934 B2

OPERATIONAL TRANSCONDUCTANCE AMPLIFIER

CROSS-REFERENCE TO RELATED APPLICATION

This application claims the priority benefit of Taiwan application serial no. 95103385, filed on Jan. 27, 2006. All disclosure of the Taiwan application is incorporated herein by reference.

BACKGROUND OF THE INVENTION

1. Field of Invention

The present invention relates to an operational transconductance amplifier (OTA), and particularly to an operational transconductance amplifier (OTA) capable of eliminating the static current component contained in the output current thereof.

2. Description of the Related Art

A drawback of a conventional operational transconductance amplifier (OTA) to perform a unilateral conversion of signals (voltage-to-current converting) is that a static current component is always companied with the output current therefrom, which though is able to reach a desired converting speed, makes the following circuit difficult to precisely process the AC current component containing useful information from the output current. To overcome the drawback, a conventional OTA shown in FIG. 1 is required, which is capable of eliminating the unwanted static current component in the output current. Referring to FIG. 1, an OTA 100 includes a differential unit 121, a differential unit 122 and a voltage-to-current converting unit 130. Wherein, the differential unit 121 includes transistors T3 and T5, while the differential unit 122 includes transistors T4 and T6.

Normally, the OTA 100 is used in a high-speed circuit. Wherein, the differential unit 121 is biased by a current mirror formed by a reference current source 110 and transistors T0 and T1 and is biased by a current source 111. The differential unit 122 is biased by a current mirror formed by a reference current source 110 and transistors T0 and T2 and is biased by a current source 112. In the current mirror, a static current component IS0 provided by the reference current source 110 would flow through the transistor T0 and makes the transistors T1 and T2 produce a current proportional to the static current IS0, respectively. For example, the transistor T1 would produce a static current I1, where I1=m×IS0.

Generally, the transistors T1 and T2 are designed to have the same aspect ratio (i.e. W/L ratio of a transistor where W and L denote channel width and channel length of a transistor). In the same way, the transistors T3 and T4 have the same aspect ratio. Thus, the static currents passing through the transistors T1~T4 are the same. The differential units 122 and 121 receive a voltage signal Vin and a voltage signal Vref, respectively, and a voltage-to-current converting unit 130 converts the voltage difference of the voltage signals Vin and Vref into a current signal $i_R$. In an embodiment, the voltage-to-current converting unit 130 is realized by a resistor with a resistance R, hence, $i_R$=(Vin−Vref)/R. At the point, if there is a difference between the voltage signals Vin and Vref, the current signal $i_R$ and a static current difference (IS1−I1) would forcedly pass through the transistor T5, so that the current signal $i_5$=(IS1−I1)+$i_R$, where (IS1−I1) is the above-mentioned static current component and $i_R$ is the above-mentioned AC current component containing information.

In order to eliminate the static current component (IS1−I1) in the output current Iout, two transistors T5 and T7 are employed to transfer the current signal $i_5$ on the transistor T5, via an output node N1, to the transistor T7 for producing a current signal $i_7$, wherein the aspect ratio of the transistor T5 is proportional to the aspect ratio of the transistor T7 in a factor. If the aspect ratio of the transistor T7 is n times as large as the aspect ratio of the transistor T5, the current signal $i_7$ would be $i_7$=n×$i_5$=n×[(IS1−I1)+$i_R$]. Thus, the current provided by the current source 113 must, by design, be IS3=n×(IS1−I1) for eliminating the static current (IS1−I1) in the output current Iout.

Since the voltage at the output node N1 is different from the voltage at the drain terminal of the transistor T0 (note that the drain terminal connects the gate terminal), the circuit is very sensitive to a channel length modulation of transistors, which leads to a drift of the static current I1 provided by the transistor T1 resulting in a complete unmatching between the static current I1 and the current IS0 passing through the transistor T0, so that the current source 113 originally designed for eliminating the static current (IS1−I1) has a much reduced compensation effect.

SUMMARY OF THE INVENTION

An object of the present invention is to provide an operational transconductance amplifier (OTA), which is capable of eliminating the static current component in the output current thereof, so that the following circuit is able to precisely process the AC current component containing information in the output current and to keep the required bandwidth.

The present invention provides an OTA which receives a differential input voltage and converts the received differential input voltage into an output current. Wherein, the differential input voltage includes a first input voltage and a second input voltage. The OTA includes a first current source, a second current source, a third current source, a first current sink, a second current sink, a third current sink, a first differential unit, a second differential unit, a third differential unit, a voltage-to-current converting unit and a current subtraction device.

Wherein, the first, second and third current sources respectively provide a first source bias current, a second source bias current and a third source bias current, while the first, second and third current sinks respectively provide a first sink bias current, a second sink bias current and a third sink bias current. The first differential unit is biased by the first source bias current and the first sink bias current, the second differential unit is biased by the second source bias current and the second sink bias current, and the third differential unit is biased by the third source bias current and the third sink bias current. The first differential unit and the third differential unit have the substantially same configurations, thus the required first and the third source bias currents are the same and the first and the third sink bias currents are the same, too.

Both the first differential unit and the third differential unit receive the second input voltage, while the second differential unit receives the first input voltage. The voltage-to-current converting unit is coupled between the first differential unit and the second differential unit, and provides a conversion current according to the voltage difference between the first input voltage and the second input voltage. The first differential unit provides a first output current according to the first source bias current, the first sink bias current and the conversion current, while the third differential unit provides a second output current according to the third source bias current and the third sink bias current. The current subtraction device subtracts the second output current from the first output current to obtain the output current and outputs it.

The present invention further provides an OTA which receives a differential input voltage and converts the received differential input voltage into a output current, wherein the differential input voltage includes a first input voltage and a second input voltage. The OTA includes a differential pair unit, a current copy unit and a current subtraction device, wherein the differential pair unit includes a first differential unit, a second differential unit and a voltage-to-current converting unit.

The first and second differential units receive the first input voltage and the second input voltage, respectively. The voltage-to-current converting unit is coupled between the first differential unit and the second differential unit and according to the voltage difference between the first input voltage and the second input voltage provides a conversion current, wherein the first differential unit outputs a first output current according to the conversion current. The current copy unit has the substantially same configuration as the first differential unit. The current copy unit and the first differential unit receive the second input voltage and the current copy unit outputs a second output current. The current subtraction device performs a subtraction between the first output current multiplied by a factor and the second output current multiplied by the factor to obtain the output current and outputting it.

The present invention uses the replica scheme, that is by copying the first differential unit to generate a third differential unit (or a current copy unit) having the substantially same configuration as the first differential unit, and then performs a subtraction between the first output current from the first differential unit and the second output current from the third differential unit (i.e. the current copy unit) in order to eliminate the static current component in the output current, so that the following circuit is able to precisely process the AC current component containing information in the output current. In addition, since the first differential unit and the third differential unit (i.e. the current copy unit) have the same layout, the output current does not vary with the channel length modulation of transistors; thus, the static current component in the output current can be eliminated completely.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve for explaining the principles of the invention.

DESCRIPTION OF THE EMBODIMENTS

Figure 2:
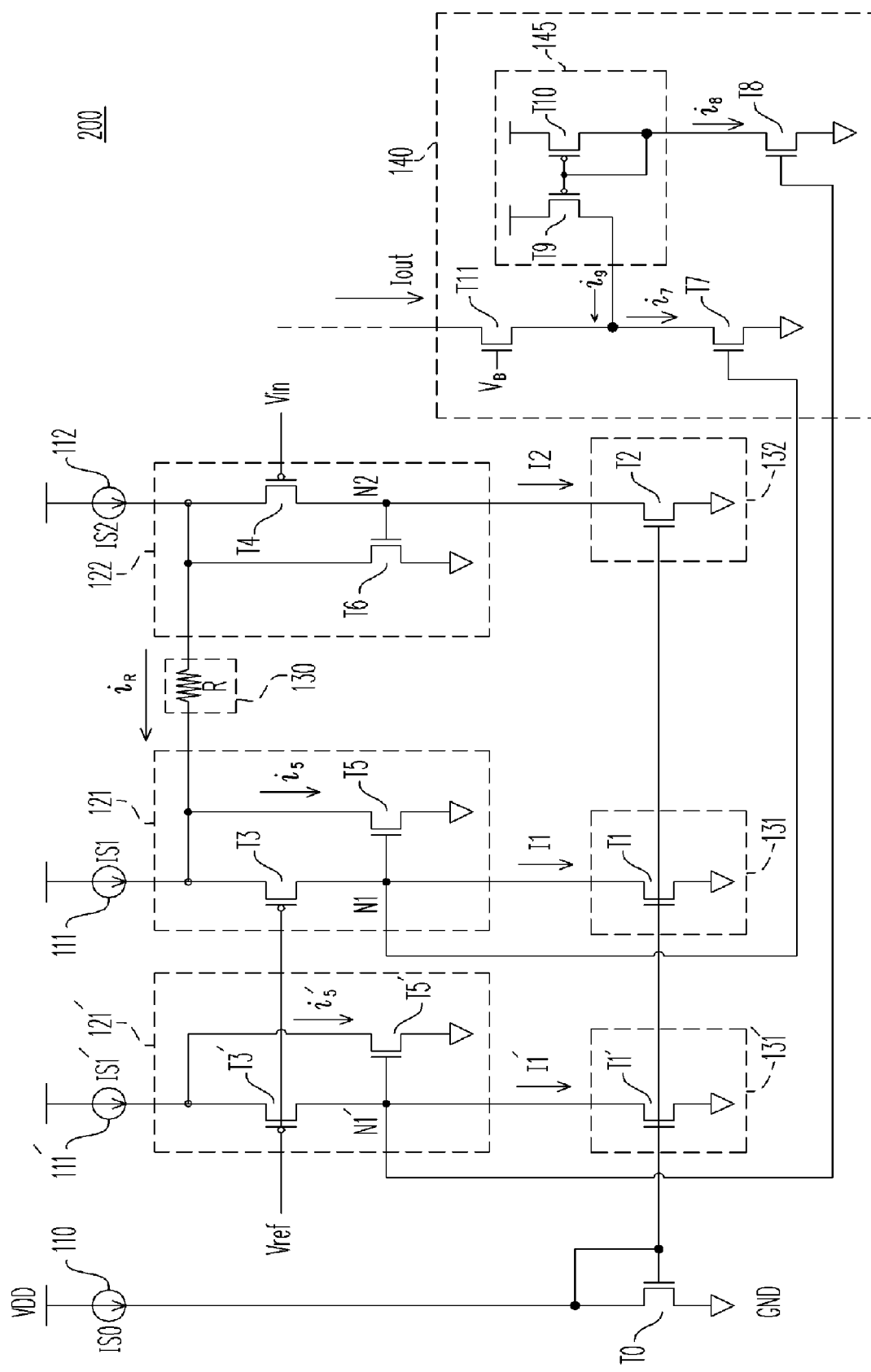
FIG. 2 is a schematic circuit drawing of an operational transconductance amplifier (OTA) capable of eliminating the static current component contained in the output current thereof according to an embodiment of the present invention.

FIG. 2 is a schematic circuit drawing of an operational transconductance amplifier (OTA) according to an embodiment of the present invention. The OTA is capable of eliminating the static current component contained in the output current thereof and overcoming the drawback of the conventional circuit where the static current component is hard to be eliminated completely since the output current thereof is affected by the channel length modulation of transistors.

Figure 1:
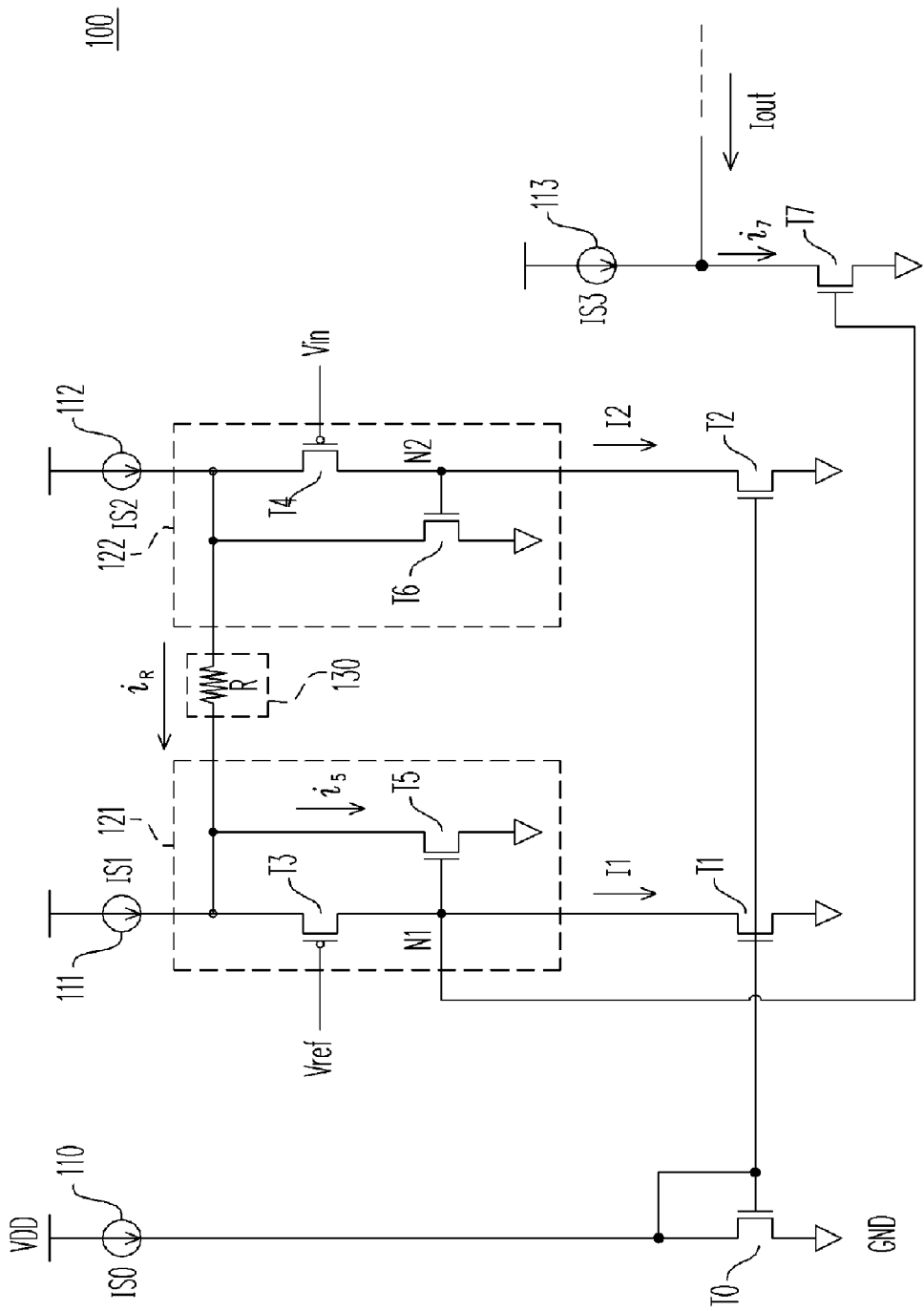
FIG. 1 is a schematic circuit drawing of a conventional operational transconductance amplifier (OTA) capable of eliminating the static current component contained in the output current thereof.

Referring to FIG. 2, an OTA 200 includes a first current source 111, a second current source 112, a third current source 111', a first current sink 131, a second current sink 132, a third current sink 131', a first differential unit 121, a second differential unit 122, a third differential unit 121', a voltage-to-current converting unit 130 and a current subtraction device 140. Wherein, the differential units 121 and 122, the voltage-to-current converting unit 130 and the bias circuit related thereto form an OTA 100 as shown in FIG. 1. Therefore, the same elements as in FIG. 1 are denoted by the same reference number herein. The OTA 200 usually is used in a high-speed circuit.

The OTA 200 receives differential input voltages and converts the received voltage into a current Iout for output, wherein the differential input voltages include a first input voltage Vin and a second input voltage Vref. In more detail, a transistor T3 and a transistor T4 in the differential unit 121 and the differential unit 122 of the OTA 200 (T3 and T4 form a differential input pair) receive the first input voltage Vin and the second input voltage Vref, respectively. Afterwards, the voltage-to-current converting unit 130 converts the voltage difference between the input voltages Vin and Vref into a conversion current $i_R$. In an embodiment, the voltage-to-current converting unit 130 is an element having R resistance, for example, an element formed by a resistor or a transistor. Thus, $i_R=(Vin-Vref)/R$. At the point, if there is a difference between the input voltages Vin and Vref, the conversion current $i_R$ and the current difference (IS1−I1) would forcedly flow through a shunt transistor T5, hence the current signal $i_5$ would be $i_5=(IS1-I1)+i_R$, where (IS1−I1) is the above-mentioned static current component and $i_R$ is the above-mentioned AC current component containing information.

As shown in FIG. 2, the differential units 121, 122 and 121' have the similar configuration. Taking the differential unit 121 as an example, the differential unit 121 includes a differential transistor T3 and a shunt transistor T5. In the embodiment, the differential transistor T3 is a P-channel metal oxide semiconductor transistor (MOS transistor), while the shunt transistor T5 is an N-channel MOS transistor. The gate terminal of the differential transistor T3 is coupled to the second input voltage Vref, both the first source/drain terminal (i.e. the source terminal) of the differential transistor T3 and the first source/drain terminal (i.e. the drain terminal) of the shunt transistor T5 are coupled to the first terminal of the differential unit 121 for receiving the first source bias current IS1. The second source/drain terminal (i.e. the source terminal) of the shunt transistor T5 is grounding. Both the second source/drain terminal (i.e. the drain terminal) of the differential transistor T3 and the gate terminal of the shunt transistor T5 are coupled to the second terminal N1 of the differential unit 121 to output the first sink bias current I1 drawn by the first current sink 131 and the voltage corresponding to the first output current $i_7$ (i.e. the voltage at the second terminal N1).

To overcome the drawback of the conventional circuit, the present invention uses the replica scheme, that is, by copying the first differential unit 121 to generate a third differential unit 121' having the substantially same configuration to the first differential unit, wherein "same configuration" means being the same in the circuit layout or being the same both in the circuit structure and the properties of the employed electronic elements, for example, the channel lengths and widths of the differential transistors T3 and T3' in the differential units 121 and 121' are the same as each other; "substantially same" means being almost conforming to each other with a little difference within a tolerance range. For the differential units 121 and 121' in the substantially same configuration, the related bias circuits thereof should be accordingly the same, thus for example, the source bias currents IS1 and IS1' are the same and the sink bias currents I1 and I1' are the same, too.

Since the copied differential unit 121' is not directly connected to the voltage-to-current converting unit 130, the current signal $i_5'$ does not contain the conversion current $i_R$ of the voltage-to-current converting unit 130, i.e. $i_5'=(IS1'-I1')=(IS1-I1)$. Moreover, since the current signal $i_5=(IS1-I1)+i_R$, thus, by using the current subtraction device 140 for capturing the current signals $i_5$ and $i_5'$ from the differential units 121 and 121', respectively, following by performing a subtraction between the captured current signals $i_5$ and $i_5'$, an output current, i.e. an AC current containing information only (the conversion signal $i_R$) can be obtained. Besides, since the differential units 121 and 121' have the substantially same configuration, it assures the voltages at the nodes N1 and N1' are the same in response to the same input voltages Vin and Vref, which further makes the static current components in the currents of the shunt transistors T5 and T5' ($i_5$ and $i_5'$, respectively) the same as each other and will not vary with the transistor channel length modulation. Therefore, after performing a subtraction between the current signal $i_5$ and $i_5'$ captured by the current subtraction device 140, the static current component is eliminated.

The current subtraction device 140 includes a first conversion transistor T7, a second conversion transistor T8 and a current mirror 145. Wherein, the aspect ratio of the conversion transistor T7 is proportional to the aspect ratio of the shunt transistor T5. For example, if the aspect ratio of the transistor T7 is n times as large as the aspect ratio of the transistor T5, after the current subtraction device 140 captures the current signal $i_5$ and produces a first output current $i_7$, there is $i_7=n\times[(IS1-I1)+i_R]$. Since the aspect ratio of the conversion transistor T8 is proportional to the aspect ratio of the shunt transistor T5' in the above-mentioned same proportion factor, the current subtraction device 140 captures the current signal $i_5'$ and produces a second output current $i_8$, $i_8=n\times(IS1-I1)$. Further, after the current mirror 145 copies the output current $i_8$ for producing a current signal $i_9$, at the node of the first source/drain terminal (i.e. the drain terminal) of the conversion transistor T7, the current signals $i_7$ and $i_9$ are subtracted from each other and an output current Iout is produced, where $Iout=n\times i_R$.

The present invention further provides an OTA, which is substantially similar to the OTA in FIG. 2. The OTA receives differential input voltages (Vin and Vref) and converts the received voltages into a current Iout for output, wherein the differential input voltages include a first input voltage Vin and a second input voltage Vref. The OTA includes a differential pair unit (121, 122, 130 and the related bias circuits), a current copy unit (121' and the related bias circuit) and a current subtraction device (140), wherein the differential pair unit includes a first differential unit 121, a second differential unit 122 and a voltage-to-current converting unit 130. For simplicity, the OTA herein is omitted to be described.

In summary, the present invention uses the replica scheme, that is, by copying the first differential unit to generate a third differential unit (or a current copy unit) having the substantially same configuration as the first differential unit, and then performs a subtraction between the first output current from the first differential unit and the second output current from the third differential unit (i.e. the current copy unit) in order to eliminate the static current component in the output current, so that the following circuit is able to precisely process the AC current component containing information in the output current. In addition, since the first differential unit and the third differential unit (i.e. the current copy unit) have the same layout, the output current does not vary with the channel length modulation of transistors; thus, the static current component in the output current can be eliminated completely.

It will be apparent to those skilled in the art that various modifications and variations can be made to the structure of the present invention without departing from the scope or spirit of the invention. In view of the foregoing, it is intended that the specification and examples to be considered as exemplary only, with a true scope and spirit of the invention being indicated by the following claims and their equivalents.

What is claimed is:

1. An operational transconductance amplifier (OTA) for receiving a differential input voltage and outputting an output current, wherein the differential input voltage comprises a first input voltage and a second input voltage; the OTA comprising:

a first current source, a second current source and a third current source for providing a first source bias current, a second source bias current and a third source bias current, respectively, wherein the first source bias current and the third source bias current are the same;

a first current sink, a second current sink and a third current sink for providing a first sink bias current, a second sink bias current and a third sink bias current, respectively, wherein the first sink bias current and the third sink bias current are the same;

a first differential unit biased by the first source bias current and the first sink bias current for receiving the second input voltage;

a second differential unit biased by the second source bias current and the second sink bias current for receiving the first input voltage;

a third differential unit biased by the third source bias current and the third sink bias current for receiving the second input voltage, wherein the third differential unit is coupled to the first differential unit and the third differential unit has the substantially same configuration as the first differential unit;

a voltage-to-current converting unit coupled between the first and the second differential units for providing a conversion current according to the voltage difference between the first input voltage and the second input voltage; and a current subtraction device for outputting the output current obtained from a subtraction between a first output current multiplied by a factor and a second output current multiplied by the factor, wherein the first output current is provided by the first differential unit according to the first source bias current, the first sink bias current and the conversion current, and the second output current is provided by the third differential unit according to the third source bias current and the third sink bias current.

2. The OTA as recited in claim 1, wherein the voltage-to-current converting unit is an element possessing a resistance.

3. The OTA as recited in claim 1, wherein the first differential unit comprises a first terminal, a second terminal, a first differential transistor and a first shunt transistor, wherein a gate terminal of the first differential transistor receives the second input voltage, a first source/drain terminal of the first differential transistor and a first source/drain terminal of the first shunt transistor are coupled to the first terminal of the first differential unit to receive the first source bias current, a second source/drain terminal of the first shunt transistor is grounded and a second source/drain terminal of the first differential transistor and a gate terminal of the first shunt transistor are coupled to the second terminal of the first differential unit to output the first sink bias current and a voltage corresponding to the first output current.

4. The OTA as recited in claim 3, wherein the second differential unit comprises a first terminal, a second terminal, a second differential transistor and a second shunt transistor, wherein a gate terminal of the second differential transistor receives the first input voltage, a first source/drain terminal of the second differential transistor and a first source/drain terminal of the second shunt transistor are coupled to the first terminal of the second differential unit to receive the second source bias current, a second source/drain terminal of the second shunt transistor is grounded and a second source/drain terminal of the second differential transistor and a gate terminal of the second shunt transistor are coupled to the second terminal of the second differential unit to output the second sink bias current.

5. The OTA as recited in claim 4, wherein the third differential unit comprises a first terminal, a second terminal, a third differential transistor and a third shunt transistor, wherein a gate terminal of the third differential transistor receives the second input voltage, a first source/drain terminal of the third differential transistor and a first source/drain terminal of the third shunt transistor are coupled to the first terminal of the third differential unit to receive the third source bias current, a second source/drain terminal of the third shunt transistor is grounded and a second source/drain terminal of the third differential transistor and a gate terminal of the third shunt transistor are coupled to the second terminal of the third differential unit to output the third sink bias current and a voltage corresponding to the second output current.

6. The OTA as recited in claim 5, wherein the first, the second and the third differential transistors are P-channel metal-oxide-semiconductor (MOS) transistors, while the first, the second and the third shunt transistors are N-channel MOS transistors.

7. The OTA as recited in claim 5, wherein the current subtraction device comprises:
a first conversion transistor, wherein a gate terminal of the first conversion transistor is coupled to the second terminal of the first differential unit and a second source/drain terminal of the first conversion transistor is grounded, the first output current multiplied by the factor being output at the first source/drain terminal of the first conversion transistor according to the voltage at the second terminal of the first differential unit;
a second conversion transistor, wherein a gate terminal of the second conversion transistor is coupled to the second terminal of the third differential unit and a second source/drain terminal of the second conversion transistor is grounded, the second output current multiplied by the factor being output at the first source/drain terminal of the second conversion transistor according to the voltage at the second terminal of the third differential unit; and
a current mirror coupled between the first source/drain terminal of the first conversion transistor and the first source/drain terminal of the second conversion transistor for copying one of the first output current multiplied by the factor and the second output current multiplied by the factor onto the other one to perform a subtraction between the first output current multiplied by the factor and the second output current multiplied by the factor.

8. The OTA as recited in claim 7, wherein an aspect ratio of the first conversion transistor is proportional to an aspect ratio of the first shunt transistor in the factor, while an aspect ratio of the second conversion transistor is proportional to an aspect ratio of the third shunt transistor in the same factor.

9. The OTA as recited in claim 7, wherein the factor is one.

10. The OTA as recited in claim 8, wherein the first and the second conversion transistors are N-channel MOS transistors.

11. An operational transconductance amplifier (OTA) for receiving a differential input voltage and outputting an output current, wherein the differential input voltage comprises a first input voltage and a second input voltage; the OTA comprising:
a differential pair unit, comprising:
a first differential unit for receiving the first input voltage;
a second differential unit for receiving the second input voltage; and
a voltage-to-current converting unit coupled between the first and the second differential units for providing a conversion current according to the voltage difference between the first input voltage and the second input voltage, wherein the first differential unit provides a first output current according to the conversion current;
a current copy unit having the substantially same configuration as the first differential unit for receiving the second input voltage and outputting a second output current; and
a current subtraction device for outputting the output current obtain from a subtraction the first output current multiplied by a factor and the second output current multiplied by the factor.

12. The OTA as recited in claim 11, wherein the voltage-to-current converting unit is an element possessing a resistance.

13. The OTA as recited in claim 11, wherein the first differential unit comprises a first terminal, a second terminal, a first differential transistor and a first shunt transistor, wherein a gate terminal of the first differential transistor receives the second input voltage, a first source/drain terminal of the first differential transistor and a first source/drain terminal of the first shunt transistor are coupled to the first terminal of the first differential unit to receive a first source bias current, a second source/drain terminal of the first shunt transistor is grounded and a second source/drain terminal of the first differential transistor and a gate terminal of the first shunt transistor are coupled to the second terminal of the first differential unit to output a first sink bias current and a voltage corresponding to the first output current.

14. The OTA as recited in claim 13, wherein the second differential unit comprises a first terminal, a second terminal, a second differential transistor and a second shunt transistor, wherein a gate terminal of the second differential transistor receives the first input voltage, a first source/drain terminal of the second differential transistor and a first source/drain terminal of the second shunt transistor are coupled to the first terminal of the second differential unit to receive a second source bias current, a second source/drain terminal of the second shunt transistor is grounded and a second source/drain terminal of the second differential transistor and a gate terminal of the second shunt transistor are coupled to the second terminal of the second differential unit to output a second sink bias current.

15. The OTA as recited in claim 14, wherein the current copy unit comprises a first terminal, a second terminal, a third differential transistor and a third shunt transistor, wherein a gate terminal of the third differential transistor receives the second input voltage, a the first source/drain terminal of the third differential transistor and a first source/drain terminal of the third shunt transistor are coupled to the first terminal of the current copy unit to receive a third source bias current, a second source/drain terminal of the third shunt transistor is grounded and a second source/drain terminal of the third differential transistor and a gate terminal of the third shunt transistor are coupled to the second terminal of the current copy unit to output a third sink bias current and a voltage corresponding to the second output current.

16. The OTA as recited in claim 15, wherein the first, the second and the third differential transistors are P-channel metal-oxide-semiconductor (MOS) transistors, while the first, the second and the third shunt transistors are N-channel MOS transistors.

17. The OTA as recited in claim 15, wherein the current subtraction device comprises:

a first conversion transistor, wherein a gate terminal of the first conversion transistor is coupled to the second terminal of the first differential unit and a second source/drain terminal of the first conversion transistor is grounded, the first output current multiplied by the factor being output at the first source/drain terminal of the first conversion transistor according to the voltage at the second terminal of the first differential unit;

a second conversion transistor, wherein a gate terminal of the second conversion transistor is coupled to the second terminal of the current copy unit and a second source/drain terminal of the second conversion transistor is grounded, the second output current multiplied by the factor being output at the first source/drain terminal of the second conversion transistor according to the voltage at the second terminal of the current copy unit; and a current mirror, coupled between the first source/drain terminal of the first conversion transistor and the first source/drain terminal of the second conversion transistor for copying one of the first output current multiplied by the factor and the second output current multiplied by the factor onto the other one to perform a subtraction between the first output current multiplied by the factor and the second output current multiplied by the factor.

18. The OTA as recited in claim 17, wherein an aspect ratio of the first conversion transistor is proportional to an aspect ratio of the first shunt transistor in the factor, while an aspect ratio of the second conversion transistor is proportional to an aspect ratio of the third shunt transistor in the same factor.

19. The OTA as recited in claim 17, wherein the factor is one.

20. The OTA as recited in claim 18, wherein the first and the second conversion transistors are N-channel MOS transistors.

* * * * *